United States Patent
Hampikian (10) Patent No.: US 10,528,510 B2
(45) Date of Patent: Jan. 7, 2020

(54) MODULE FOR A LOGIC CONTROLLER

(71) Applicant: Schneider Electric Industries SAS, Rueil-Malmaison (FR)

(72) Inventor: Pascal Hampikian, Paris (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 24 days.

(21) Appl. No.: 15/433,780

(22) Filed: Feb. 15, 2017

(65) Prior Publication Data
US 2017/0242818 A1    Aug. 24, 2017

(30) Foreign Application Priority Data

Feb. 18, 2016 (EP) .................... 16305182

(51) Int. Cl.
| | | |
|---|---|---|
| *G06F 15/177* | (2006.01) | |
| *G06F 13/40* | (2006.01) | |
| *G06F 13/36* | (2006.01) | |
| *G06F 13/42* | (2006.01) | |
| *H05K 5/00* | (2006.01) | |

(52) U.S. Cl.
CPC .......... *G06F 13/4068* (2013.01); *G06F 13/36* (2013.01); *G06F 13/409* (2013.01); *G06F 13/42* (2013.01); *H05K 5/0065* (2013.01); *H05K 5/0069* (2013.01)

(58) Field of Classification Search
USPC ..................................................... 710/8, 10
See application file for complete search history.

(56) References Cited

U.S. PATENT DOCUMENTS

| | | |
|---|---|---|
| 5,037,310 A | 8/1991 | Marinello |
| RE43,171 E * | 2/2012 | Chu .................. G06F 21/71 713/193 |

(Continued)

FOREIGN PATENT DOCUMENTS

DE    10 2012 021 055 A1    4/2014

OTHER PUBLICATIONS

European Search Report dated Sep. 5, 2016 in European Application 16305182.4, filed Feb. 18, 2016 (with Written Opinion).

*Primary Examiner* — Ilwoo Park
(74) *Attorney, Agent, or Firm* — Oblon, McClelland, Maier & Neustadt, L.L.P.

(57) ABSTRACT

A modular assembly of a module for a Logic Controller, including a container and a cartridge. The cartridge has a first electrical interface part and an electronic circuit arranged to provide a predetermined electronic function. The container has a housing, a backplane connector, a terminal connector and a receptacle extending inside the housing and adapted to receive the cartridge. The receptacle includes a second electrical interface part adapted to connect with the first electrical interface part. The cartridge and the receptacle are arranged to electrically connect the first and second electrical interface parts to establish an electrical interface when the cartridge is removably inserted in the receptacle of the container. The housing of the container defines the mechanical form factor of the module, while the cartridge determines the electronic functionality of the module. Accordingly, multiple containers having different form factors may accommodate the same cartridge.

15 Claims, 4 Drawing Sheets

(56) References Cited

U.S. PATENT DOCUMENTS

| | | | |
|---|---|---|---|
| 2003/0074489 A1* | 4/2003 | Steger | G16H 40/63 710/1 |
| 2004/0209525 A1 | 10/2004 | Konrad et al. | |
| 2008/0270105 A1* | 10/2008 | Poplack | G06F 1/206 703/23 |
| 2010/0312418 A1* | 12/2010 | Kraft | G06F 13/409 701/1 |
| 2012/0182698 A1 | 7/2012 | Langels et al. | |
| 2013/0115821 A1* | 5/2013 | Golko | H01R 13/516 439/638 |
| 2013/0297928 A1* | 11/2013 | Wyss | G05B 19/042 713/100 |
| 2015/0257294 A1 | 9/2015 | Murata et al. | |
| 2017/0273610 A1* | 9/2017 | Suri | A61B 5/14546 |

* cited by examiner

MODULE FOR A LOGIC CONTROLLER

The present invention relates to logic controllers, and more particular to a modular assembly of a module for programmable logic controllers (PLC), such as an Input/output interface of a logic controller.

BACKGROUND

A programmable logic controller (PLC) is a piece of automation equipment capable of driving, controlling and/or monitoring one or more processes. For example, the PLC makes it possible to control machines of an assembly line in an industrial plant or to drive automatic handling systems.

A controller generally has a modular-type of architecture and is made up of various modules which may be grouped and connected together in a rack, or more in general referred to as an automation island. The rack itself may include a communication module constituting a transmission bus, commonly referred as backplane.

The type and number of modules of the controller depends on the needs of the process or processes to be automated. Typically, the controller further includes a power module, a central processing unit and several input-output (I/O) modules, including relays. The I/O modules may further be characterized by the type of signals handled: digital and/or analog signals.

As PLC's may be applied in different environments with varying demands, accordingly various form factors are available to address the requirements related to such different environments. In the typical situation of mounting an electrical installation in an industrial Automation environment, the electrical wiring requires several types of electrical and mechanical interfaces which results in supplying several different types of industrial products pieces and associated references. The number of product variations can quickly rise, even for a simple automation system.

These constraints put a demand on the end user for managing the amount of functional references in order to ensure complete overview of its system, but also to maintain the system by keeping large quantities of spare parts in storage.

SUMMARY OF INVENTION

Though various modules varying in form factor are available, the electrical function provided by these may in many circumstances be the same. For example, one product line of a certain form factor packaging may include different modules for providing the electronic functions of digital input (Di), analog input (Ai), digital output (Do), analog output (Ao), Relay or Universal I/O (In a Universal I/O module one channel may be configured as either Input or Output, and as either Analog or Logical by the user itself). And another product line may provide exactly the same spectrum of electronic functions, only differing in form factor.

The invention relates to a modular assembly of a module for a Programmable Logic Controller (PLC), having a container and a cartridge. The cartridge has a first electrical interface part and an electronic circuit arranged to provide an electronic function. The container has a housing, a backplane connector, a terminal connector and a receptacle. The receptacle extends inside the housing and is adapted to receive the cartridge. The receptacle includes a second electrical interface part adapted to be connectable with the first electrical interface part. The cartridge and the receptacle are arranged to electrically connect the first and second electrical interface parts to establish an electrical interface when the cartridge is removably inserted in the receptacle of the container.

The mechanical form factor of the PLC module is defined by the housing of the container, while the electronic functionality of the PLC module is determined by the cartridge. As the cartridge may be removably inserted in the container, this allows assembling a PLC module by selecting the container and the cartridge independently to obtain the desired combination of mechanical form factor and electronic functionality. Accordingly, multiple containers having different form factors may accommodate the same cartridge. The stock required to address a number of varying combinations may thereby be reduced.

Furthermore, modular assembly may provide further advantages for maintenance or upgrade of a module as only the cartridge may need to be replaced.

BRIEF DESCRIPTION OF THE DRAWINGS

By way of example only, the embodiments of the present disclosure will be described with reference to the accompanying drawings, wherein.

DETAILED DESCRIPTION

Figure 1A:
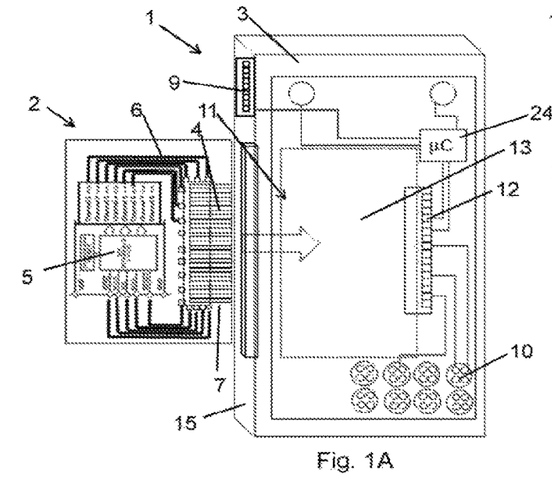
FIGS. 1A, 1B illustrate schematically an example of a module in accordance with an implementation.
Figure 1B:
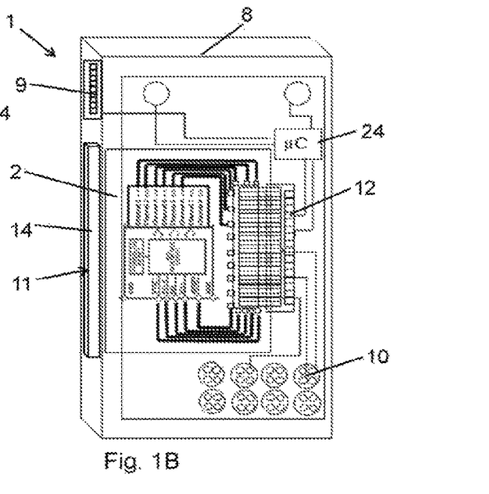

Referring to FIGS. 1A and 1B, an example of a module 1 for a Programmable Logic Controller (PLC) is shown. FIG. 1A shows a cartridge 2 and a container 3 into which the cartridge 2 may be inserted as indicated by the arrow. The cartridge 2 has a first electrical interface part 4 and an electronic circuit 5 arranged to provide an electronic function. In this example, the cartridge 2 has a Printed Circuit Board (PCB) as its' main body 6. A connector portion 7 projecting from the main body 6 carries the first electrical interface part 4, which in this example is implemented as an edge connector member of a slot and edge type connector.

The container 3 has a housing 8, a backplane connector 9, a terminal connector 10 and a receptacle 11. The receptacle 11 extends inside the housing 8 and is adapted to receive the cartridge 2. The receptacle 11 includes a second electrical interface part 12. In this example, the receptacle 11 extends in a hollow cavity 13 of the housing 8 and is mainly demarcated by the second electrical interface part 12 and an opening 14 in a side 15 of the housing 8. More in general, a receptacle may be identified as the part or parts of the container housing capable of receiving the cartridge, establishing the electrical interface, fixating the cartridge either on or after insertion and/or capable of releasing the cartridge for removal out of the container. Hence, it is not necessarily embodied as a single element, but may be constituted by separately distinguishable components.

The second electrical interface part 12 is adapted to be connectable with the first electrical interface part 4; in this example a slot connector member of a slot and edge type connector, which matingly connects with the first electrical interface part 4. The edge connector member 4 and the slot connector member 12 thus provide an electrical interface between the cartridge 2 and the container 3 when connected. The electrical interface may provide a plurality of electrical channels, of which each electrical channel may function as an input or output and support analog or digital signals. Digital signals may also be referred to as logical signals. The cartridge 2 and the receptacle 11 are arranged to electrically connect the first and second electrical interface parts 4, 12 to establish the electrical face when the cartridge 2 is removably inserted in the receptacle 11 of the container 3.

The container 3 further includes a processing unit 24 which is connected between the second electrical interface part 12 and the backplane connector 9. The processing unit 24 provides a gateway between the cartridge interface 4, 12 and a PLC backplane interface. In this manner, any type of PLC backplane interface protocol may communicate with the cartridge interface by appropriate configuration of the processing unit 24. For example, depending on the PLC backplane interface protocol being Serial Peripheral Interface (SPI) or Ethernet, the processing unit 24 may be configured as to provide proper communicative connection with the cartridge interface protocol. The cartridge preferably is configured to comply with the Serial Peripheral Interface (SPI) bus protocol, which allows a straightforward design. Such a cartridge may then easily be interchanged between containers of different form factors. In addition, the processing unit allows communication with different backplane protocols applicable.

In general, the type of gateway provided by the processing unit is linked to the form factor of the module. Thus, the processing unit only needs to be configured for one type of gateway, allowing for example the use of a simple dedicated chip.

Figure 2:
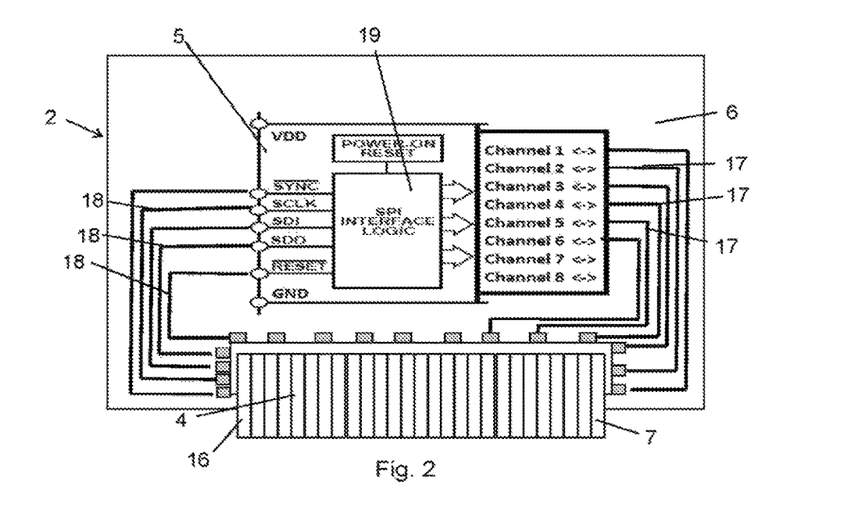
FIG. 2 illustrates an example of a cartridge in accordance with an implementation.

Referring to FIG. 2, the cartridge 2 of FIGS. 1A and 1B is shown in more detail. As mentioned above, the main body 6 is a PCB having a projecting portion 7 carrying the edge connector member 4. Electrical contacts 16 are evenly distributed along the edge of the PCB. The PCB 6 further carries the electronic circuit 5 has multiple electrical leads 17, 18 that connect to edge connector member 4. The electronic circuit 5 further includes a processing unit 19.

Figure 3A:
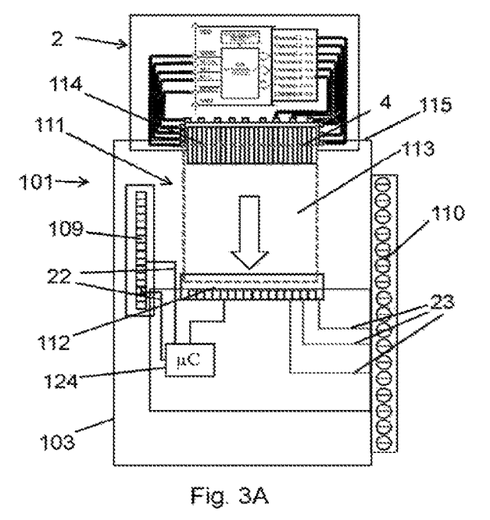
FIGS. 3A, 3B illustrate schematically another example of a module in accordance with an implementation.
Figure 3B:
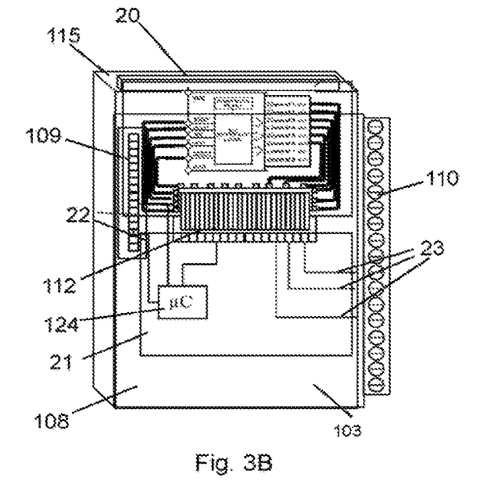

Referring to FIGS. 3A and 3B, another example of a module 101 for a Programmable logic controller (PLC) is shown. FIG. 3A shows the cartridge 2 and another container 103 into which the cartridge 2 may be inserted as indicated by the arrow. The cartridge 2 in this example is the same as that of FIGS. 1A and 1B.

The container 103 has a housing 108; a backplane connector 109, a terminal connector 110 and a receptacle 111. The receptacle 111 extends inside the housing 108 and is adapted to receive the cartridge 2. The receptacle 111 includes another second electrical interface part 112 similar to that of FIGS. 1A and 1B. In this example, the receptacle 111 extends in a hollow cavity 113 of the housing 108 and is demarcated by the second electrical interface part 112, and a retainer 20 closing an opening 114 in a side 115 of the housing 108.

The container 108 further has a PCB 21 that carries leads 22, 23 that provide internal connection of the backplane connector 109 and the terminal connector 110 respectively to the processing unit 124 and the second electrical interface part 112.

The edge connector member 4 connects to the slot connector member 112 similarly as described above in relation to FIGS. 1A and 1B. The edge connector member 4 and the slot connector member 112 thus provide an electrical face between the cartridge 2 and the container 103 when connected. The cartridge 2 and the receptacle 111 are arranged to electrically connect the first and second electrical interface parts 4, 112 to establish the electrical face when the cartridge 2 is removably inserted in the receptacle 111 of the container 103.

The retainer 20 in this example is provided as a trapdoor to mechanically fixate the cartridge 2 when the cartridge 2 is inserted in the receptacle 111 of the container 103. As part of the trap door, the retainer 20 may further include a spring mechanism to firmly push the cartridge into slot connector member 112. Other types of force exerting arrangements may be used likewise. In other embodiments, the retainer may be integrated with the second electrical interface part in a connector member; such as for example a slot connector exerting frictional force on a edge slot connector of the cartridge to fixate the cartridge. Apart from a slot and edge card connection, other connection types may be applied such as for example a socket and plug connection or a jack and plug connection.

Returning to FIGS. 1A and 1B, the second electrical interface part 12 may have a retainer function incorporated. In this example, the width of the slot connector member 12 is such that it pinches the edge connector member 4 when inserted in the slot connector member 12. Thus, the retainer and the second electrical interface part are integrated in a single connector member 12. In another example, the edge connector member 4 may be provided with local protrusions that become wedged in the slot connector member 12 when the cartridge is inserted in the receptacle 11. Other means for fixating may be applied to obtain a retaining function. Hence, conversely the retainer may also be an integral part of the first electrical interface part 4. More in general, the electrical interface may be integrated with retaining means to mechanically fixate the cartridge 2 when the cartridge 2 is inserted in the receptacle 11 of the container 3.

A module for a PLC may be any input-output module handling analog, digital or logical signals. In one particular case, it may serve as a relay i.e. switch providing at the output either the input signal or no signal, depending on the status of the relay. PLC modules are in general equipped with backplane connectors and terminal connectors. The backplane connectors are to connect the module with the backplane which serves as the communication module for the whole of the PLC. The terminal connectors are to connect the module to the peripheral parts, such as sensors, actuators and machines that are part of the automated process to be controlled.

Accordingly, the electronic circuit 5 of the cartridge 2 may be configured to provide any desired electronic function. This may include a Digital Input (Di), an Analog Input (Ai), a Digital Output (Do), an Analog output (Ao), a Relay or Universal I/O or any combination thereof. Hence, each individual electrical channel of the electrical interface may be configured as an input or an output channel and being either analog or digital. The electrical interface established by connection of the edge connector member 4 and the slot connector member 12 may be connected to leads of both the terminal connector and the backplane connector.

The processing unit of the container 24, i.e. the container processing unit, may be arranged for exchanging container type data with the cartridge processing unit 19. For example, when the module 1 is powered on, the container processing unit 24 transmits container type data indicating the type of container, operational restrictions and limitations, and/or configuration settings. Thus, the container type data determines how the electronic function of the electronic circuit 5 should be configured. The cartridge processing unit (19, 119) may be arranged for configuring the electronic function of the cartridge according to the exchanged container type data.

The container type data may include various parameters and settings, such as a maximum current output level, a maximum thermal dissipation, and/or a maximum processing frequency. Furthermore, the container type data may include, for each electrical channel whether it is an input or output and whether it is digital or analog. For example, the output current may set at a limit of 0.2 A, 0.5 A or other desired maximum.

Exchanging the container type data allows the cartridge to adapt itself to the container in which it is inserted. For example, a container complying with IP67 according to IEC standard 60529 on degrees of protection provided by enclosures, provides a high level of ingress protection. But it also has less ventilation or cooling capacities and accordingly components inside are prone to overheating. Whereas a container complying with IP20 according to the IEC standard 60529 has more ventilation capabilities and is better suited for dissipating heat.

So, the container type drives which electronic function is required from the cartridge. And consecutively the cartridge may configure its' electronic function to comply therewith by setting a maximum level for output current, by reducing the processing frequency or other suitable settings.

As described above in reference to FIG. 3, internally the terminal connector 110 is electrically connected to slot connector member 112 via leads 23. And the backplane connector 109 is electrically connected to the processing unit 24 via leads 22, which in turn is electrically connected to slot connector member 112. The container of FIGS. 1A & 1B has similar electrical connections and processing unit. The processing unit 24 provides conversion between the backplane PLC communication protocol and the cartridge interface. Hence, it may be configured to perform various conversions depending on the type of cartridge 2 inserted in the container 3, 103.

In the examples described above, the leads 22, 23 stemming from the backplane connector 109 and terminal connector 110 all terminate in the slot connector member 112. Accordingly, the single slot connector member 112 has a backplane connector portion and a terminal connector portion. Consequently, the design of the cartridge is such that the edge connector member 4 connects both the backplane connector portion and the terminal connector portion of the single slot connector member 112. However, the edge connector member may show a single edge, as shown in the examples of FIGS. 1 to 3 above, or it may show a split edge or two separate edge connector member parts.

Figure 4:
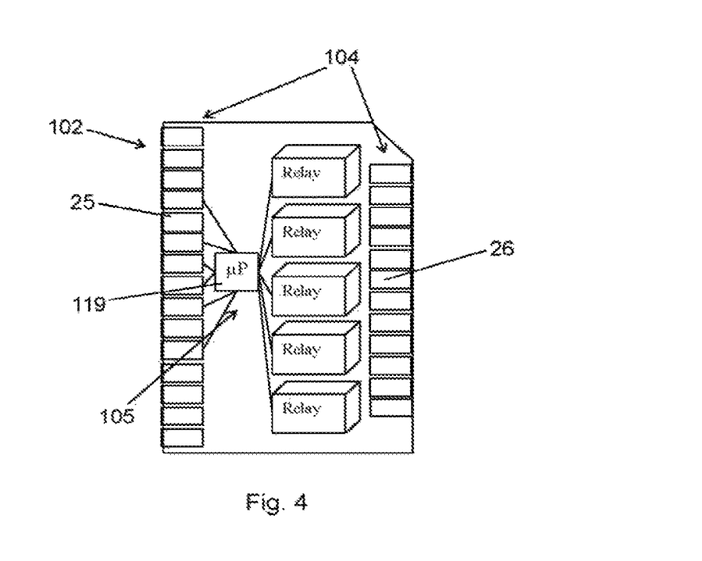
FIG. 4 illustrates another example of a cartridge in accordance with an implementation.

Referring to FIG. 4, another example of a cartridge 102 is shown. In this example, the cartridge 102 has a first electrical interface 104 consisting of two edge connector members 25, 26, viz. a backplane edge connector member 25 and a terminal edge connector member 26. An electronic circuit 105 including a processing unit 119 is electronically arranged between the backplane edge connector member 25 and the terminal edge connector member 26. The electronic circuit 105 provides the electronic functionality in the same manner as described above, in this example a relay i.e. switching circuit function is provided. Exchange of container type data between container and cartridge and configuration of the cartridge may proceed in a similar manner as explained above. Other electronic functionality provided by the electronic circuit may include: Digital Input (Di), Analog Input (Ai), Digital Output (Do), analog output (Ao) or Universal I/O.

Figure 5:
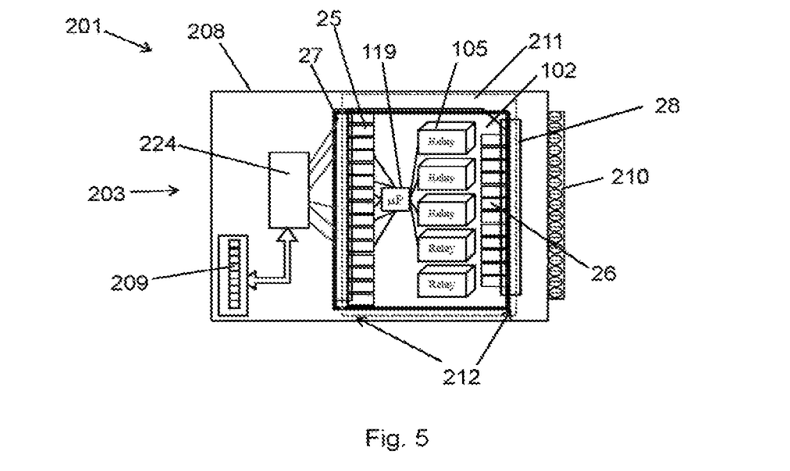
FIG. 5 illustrates schematically another example of a module in accordance with an implementation.

The two edge connector members 25, 26 of the cartridge 102 of FIG. 4 require a receptacle having a different slot connector member. Shown in FIG. 5 is another example of a module 201 with a container 203 having a housing 208 and a different receptacle 211. The receptacle 211 has a second electrical interface 212 that consists of two slot connector members 27, 28, viz. a backplane slot connector member 27 and a terminal slot connector member 28. The backplane edge connector member 25 and the terminal edge connector member 26 respectively connect to the backplane slot connector member 27 and a terminal slot connector member 28 when the cartridge 102 is inserted into the container 203.

The container 203 further includes a processing unit 224 connecting the backplane slot connector member 27 to a backplane connector 209. The processing unit 224 provides conversion between the backplane PLC communication protocol and the cartridge interface protocol. The terminal slot connector member 28 is connected with a terminal connector 210. On insertion of the cartridge 102 of FIG. 4 into the container 203 as shown in FIG. 5, an electronically functional module is assembled. The electronic functionality is fully defined by the electronic circuit 105 of the cartridge 102.

Figure 6:
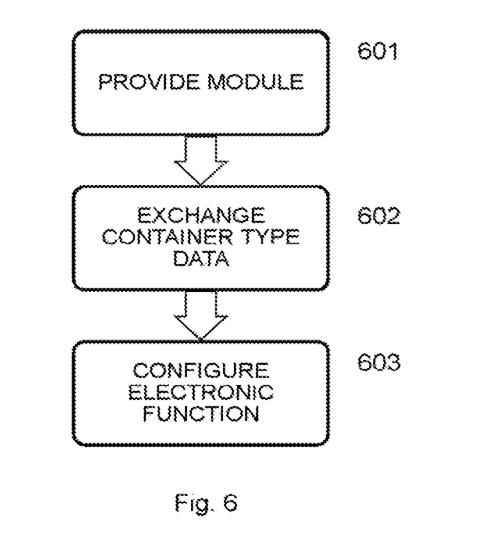
FIG. 6 illustrates an example of a method for configuring a module for a Logic Controller in accordance with the invention.

Turning to FIG. 6, an example of a method for configuring a module for a Logic Controller is illustrated. When a module 1 assembled 601 by inserting one cartridge 2, 102 in one container 3, 103, 203 is powered on, the container 3, 103, 203 and the cartridge 2, 102 exchange 602 container type data between them. Next, the electronic function of the cartridge is configured 603 according to the container type data.

The exchange 602 of container type data may include the container processing unit 24, 124, 224 sending the container type data to the cartridge 2, 102. Configuring 603 the electronic function may include the cartridge processing unit 19, 119 processing the container type data and configuring settings for the electronic function of the cartridge 2, 102. And, as indicated above, the container type data may include various parameters and settings, such as the maximum current output level, the maximum thermal dissipation, and/or the maximum processing frequency. And furthermore, the container type data may include, for each electrical channel whether it is input or output and whether it is digital or analog.

Figure 7:
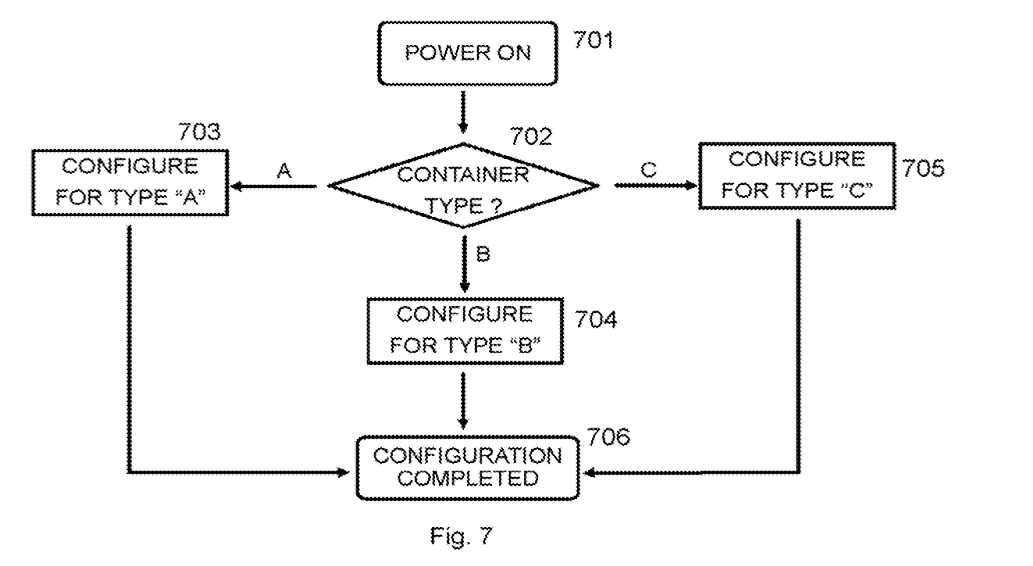
FIG. 7 is a flowchart illustrating an example of an implementation of the method of FIG. 6.

Shown in FIG. 7 is a flowchart illustrating an example of an implementation of the method as described with reference to FIG. 6. The process starts by powering on 701 the assembled module. In response to exchange of the container type data it is determined 702 what the container type it is: A, B, or C. Depending thereon, the electronic function of the cartridge is configured according to the container type. So for container type "A", configuration 703 for type "A" is performed. For container type "B", configuration 704 for type "B" is performed. And for container type "C", configuration 705 for type "C" is performed.

Each container type A, B and C may represent one particular kind of container, such as for e.g. IP20, IP45, IP55, IP67 or any other container classified according to the IP code of IEC standard 60529. Once the cartridge is configured in accordance with the container type, the configuration is completed 706 and the Logic Controller may initiate operation.

Although the present invention has been described above with reference to specific embodiments, it is not intended to be limited to the specific form set forth herein. Rather, the invention is limited only by the accompanying claims and, other embodiments than the specific above are equally possible within the scope of these appended claims.

Furthermore, although exemplary embodiments have been described above in some exemplary combination of components and/or functions, it should be appreciated that, alternative embodiments may be provided by different combinations of members and/or functions without departing from the scope of the present disclosure. In addition, it is specifically contemplated that a particular feature described, either individually or as part of an embodiment, can be combined with other individually described features, or parts of other embodiments.

The invention claimed is:

1. A module for a Programmable Logic Controller (PLC), comprising:
   a cartridge comprising:
   a first electrical interface part; and
   an electronic circuit arranged to provide an electronic function; and
   a container comprising:
   a housing;
   a backplane connector;
   a terminal connector; and
   a receptacle that includes a hollow opening extending inside the housing and adapted to allow the cartridge to be inserted into the opening, the receptacle comprising a second electrical interface part adapted to be connectable with the first electrical interface part;
   wherein the cartridge and the receptacle are arranged to electrically connect the first and second electrical interface parts to establish an electrical interface with a plurality of electrical channels when the cartridge is removably inserted in the receptacle of the container,
   wherein the electronic circuit of the cartridge comprises a cartridge processing unit;
   wherein the container further comprises a container processing unit arranged for exchanging predetermined container type data with the cartridge processing unit in response to the module being powered on, wherein the container type data, which is based at least in part on the ventilation or cooling capabilities of the container, comprises:
   maximum current output level;
   maximum thermal dissipation; and
   maximum processing frequency; and
   wherein the cartridge processing unit is arranged for configuring the electronic function of the cartridge according to the container type data.

2. The module according to claim 1, wherein the container type data comprises:
   for each electrical channel whether it is an input or output and whether it is digital or analog.

3. The module according to claim 1, wherein the receptacle further comprises a retainer arranged to mechanically fixate the cartridge when the cartridge is inserted in the receptacle of the container.

4. The module according to claim 1, wherein the cartridge comprises a printed circuit board and the first electrical interface is distributed along an edge of the printed circuit board.

5. The module according to claim 1, wherein the processing unit is configured to provide a gateway between the second electrical interface and the backplane connector.

6. The module according to claim 1, wherein the first and second electrical interface parts are of the Serial Peripheral Interface (SPI) type.

7. The module according to claim 1, wherein the electronic function provided by the electronic circuit comprises at least one of the following: a Digital Input (Di), Analog Input (Ai), Digital Output (Do), analog output (Ao), Relay or Universal I/O.

8. The module according to claim 1, wherein the retainer and the second electrical interface part are integrated in a connector member.

9. The module according to claim 1, wherein the first electrical interface comprises a backplane edge connector member and a terminal edge connector member; and
   the second electrical interface comprises a backplane slot connector member and a terminal slot connector member.

10. A kit of parts comprising:
    a module according to claim 1; and
    one or more containers,
    wherein the containers have different form factors.

11. A method for configuring a module for a Logic Controller, comprising:
    providing a module according to claim 1;
    exchanging container type data between the container and the cartridge;
    configuring the electronic function of the cartridge according to the container type data.

12. The method according to claim 11, comprising:
    the container processing unit sending the container type data to the cartridge;
    the cartridge processing unit processing the container type data and configuring settings for the electronic function of the cartridge; and
    wherein the container type data comprises:
    for each electrical channel/line whether it is an input or output and whether it is digital or analog.

13. The module according to claim 1,
    wherein the container is one of a plurality of types of containers classified according to the IP code of IEC standard 60529.

14. A cartridge comprising:
    a first electrical interface part; and
    an electronic circuit arranged to provide an electronic function,
    wherein the cartridge is configured to be inserted into a container in order to form a module for a Programmable Logic Controller (PLC), the container including:
    a housing;
    a backplane connector;
    a terminal connector; and
    a receptacle that includes a hollow opening extending inside the housing and adapted to allow the cartridge to be inserted into the opening, the receptacle comprising a second electrical interface part adapted to be connectable with the first electrical interface part;
    wherein the cartridge and the receptacle are arranged to electrically connect the first and second electrical interface parts to establish an electrical interface with a plurality of electrical channels when the cartridge is removably inserted in the receptacle of the container,
    wherein the electronic circuit of the cartridge comprises a cartridge processing unit;
    wherein the container further comprises a container processing unit arranged for exchanging predetermined container type data with the cartridge processing unit in response to the module being powered on, wherein the container type data, which is based at least in part on the ventilation or cooling capabilities of the container, comprises:

maximum current output level;
maximum thermal dissipation; and
maximum processing frequency; and
wherein the cartridge processing unit is arranged for configuring the electronic function of the cartridge according to the container type data.

15. A container comprising:
a housing;
a backplane connector;
a terminal connector; and
a receptacle that includes a hollow opening extending inside the housing and adapted to allow the cartridge to be inserted into the opening in order to form a module for a Programmable Logic Controller (PLC), the receptacle comprising a second electrical interface part adapted to be connectable with a first electrical interface part of a cartridge,
wherein the cartridge includes an electronic circuit arranged to provide an electronic function,
wherein the cartridge and the receptacle are arranged to electrically connect the first and second electrical interface parts to establish an electrical interface with a plurality of electrical channels when the cartridge is removably inserted in the receptacle of the container,
wherein the electronic circuit of the cartridge comprises a cartridge processing unit;
wherein the container further comprises a container processing unit arranged for exchanging predetermined container type data with the cartridge processing unit in response to the module being powered on, wherein the container type data, which is based at least in part on the ventilation or cooling capabilities of the container, comprises:

maximum current output level;
maximum thermal dissipation; and
maximum processing frequency; and
wherein the cartridge processing unit is arranged for configuring the electronic function of the cartridge according to the container type data.

\* \* \* \* \*